United States Patent [19]

Mihara

[11] Patent Number: 4,991,136
[45] Date of Patent: Feb. 5, 1991

[54] SEMICONDUCTOR ASSOCIATIVE MEMORY DEVICE WITH MEMORY REFRESH DURING MATCH AND READ OPERATIONS

[75] Inventor: Masaaki Mihara, Hyogo, Japan

[73] Assignee: Mitsubishi Denki Kabushiki Kaisha, Tokyo, Japan

[21] Appl. No.: 303,884

[22] Filed: Jan. 30, 1989

[30] Foreign Application Priority Data

Jan. 29, 1988 [JP] Japan .................. 63-20762

[51] Int. Cl.⁵ .................. G11C 15/00; G11C 11/34; G11C 7/00
[52] U.S. Cl. .................. 365/49; 365/188; 365/174; 365/222
[58] Field of Search .................. 365/49, 222, 174, 188

[56] References Cited

U.S. PATENT DOCUMENTS

| | | | |
|---|---|---|---|
| 3,701,980 | 10/1972 | Mundy .................. | 365/49 |
| 3,705,390 | 12/1972 | Mundy .................. | 365/49 |
| 4,646,271 | 2/1987 | Uchiyama et al. .......... | 365/49 |
| 4,831,585 | 5/1989 | Wade et al. .............. | 365/49 |
| 4,833,643 | 5/1989 | Hori .................... | 365/49 |
| 4,862,412 | 8/1989 | Fried et al. ............. | 365/49 |
| 4,890,260 | 12/1989 | Chuang et al. ........... | 365/49 |

FOREIGN PATENT DOCUMENTS

WO8703415A 4/1987 European Pat. Off. .............. 365/49

OTHER PUBLICATIONS

Joseph L. Mundy et al., "Low-Cost Associative Memory", IEEE Journal of Solid-State Circuits, vol. SC-7, No. 5, Oct. 1972, pp. 364–369.

*Primary Examiner*—Stuart N. Hecker
*Assistant Examiner*—Michael A. Whitfield
*Attorney, Agent, or Firm*—Lowe, Price, LeBlanc, Becker & Shur

[57] ABSTRACT

A semiconductor associative memory device comprises a content addressable memory cell connected to a word line, a bit line, an inversion bit line and a match line. The memory cell comprises first and second n channel MOS transistors constituting a capacitance element. When the word line is activated, a value on the bit line is stored in the first n channel MOS transistor, and the value on the inversion bit line is stored in the second n channel MOS transistor. When the first n channel MOS transistor and the bit line are in the active state, or when the second n channel MOS transistor and the inversion bit line are in the active state, a control terminal is activated. N channel MOS transistors are connected between the control terminal and the first and second n channel MOS transistors, and the first and second n channel MOS transistors are refreshed during matching and reading by means of these transistors.

4 Claims, 5 Drawing Sheets

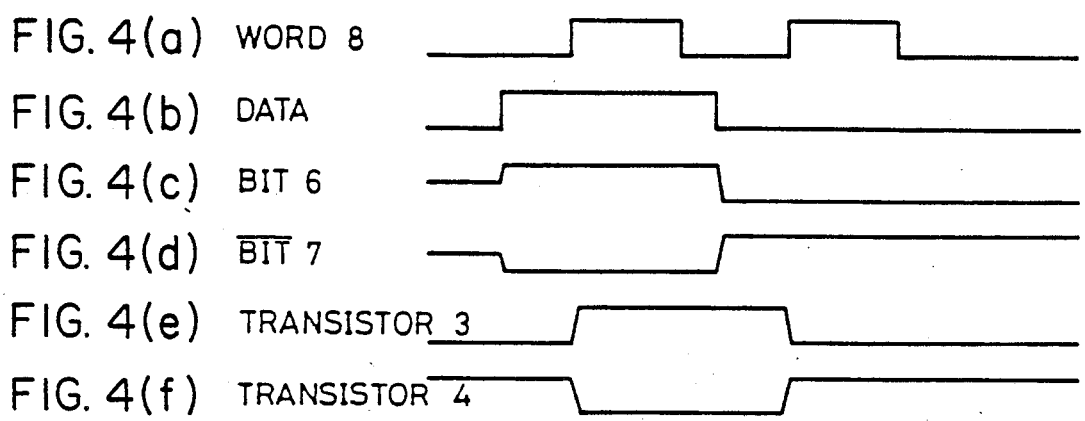
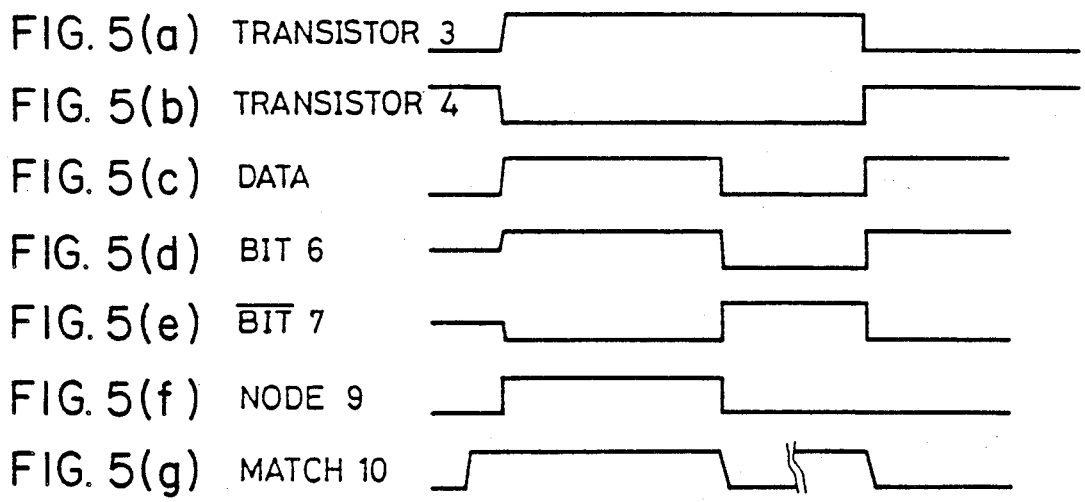

PRIOR ART
FIG. 7(a) WORD 8 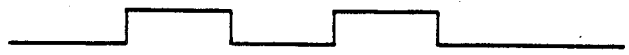
FIG. 7(b) DATA 
FIG. 7(c) BIT 6 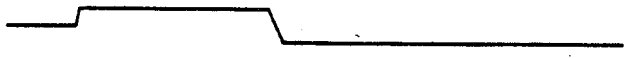
FIG. 7(d) $\overline{BIT\ 7}$ 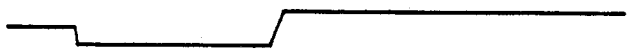
FIG. 7(e) TRANSISTOR 3 
FIG. 7(f) TRANSISTOR 4 
FIG. 8(a) TRANSISTOR 3 
FIG. 8(b) TRANSISTOR 4 
FIG. 8(c) DATA 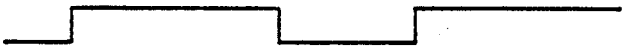
FIG. 8(d) BIT 6 
FIG. 8(e) $\overline{BIT\ 7}$ 
FIG. 8(f) CONTROL TERMINAL 9 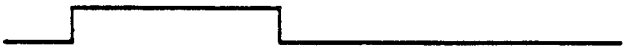
FIG. 8(g) MATCH 10 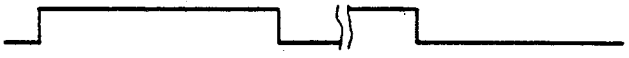
FIG. 8(h) TRANSISTOR 3 
FIG. 8(i) TRANSISTOR 4 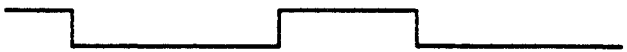

SEMICONDUCTOR ASSOCIATIVE MEMORY DEVICE WITH MEMORY REFRESH DURING MATCH AND READ OPERATIONS

BACKGROUND OF THE INVENTION

1. Field of the Invention

The present invention relates to semiconductor associative memory devices. More specifically, the present invention relates to semiconductor associative memory devices having content addressable memory cells with bit matching function.

2. Description of the Background Art

FIG. 1 is a schematic block diagram of a conventional system employing an associative memory, and FIG. 2 is a schematic block diagram showing the whole structure of the associative memory.

First, referring to FIGS. 1 and 2, the use of the conventional associative memory will be described. Referring to FIG. 1, a main memory 20 and a cache memory 40 are connected to a CPU 100 through a data bus 50 and an address bus 60. A dynamic RAM or a magnetic disk device having relatively slow access time but larger capacitance, which is inexpensive, is used as the main memory 20. On the other hand, an associative memory which has smaller capacitance but faster access time, which is expensive, is used as the cache memory 40. The cache memory 40 is provided to shorten the access time of the main memory 20, in which, of the data stored in the main memory 20, those which are high in access frequency are stored together with the addresses thereof. The writing and comparing operation of the cache memory 40 are controlled by a memory controller 30.

In a system structured as described above, the cache memory 40 is accessed prior to the access of the main memory 20 by the CPU 100. More specifically, when an address signal is outputted onto the address bus 60 from the CPU 100, the cache memory 40 is controlled by the controller 30, whether the address corresponding to the address signal is stored or not in the cache memory 40 is checked, and when the corresponding address is stored in the cache memory 40, a hit signal is outputted from the cache memory 40 to be applied to the memory controller 30. When the hit signal is applied from the memory controller 30 to the CPU 100, data is read from the corresponding area of the cache memory 40 where the address corresponding to the output address signal have been stored. If the address corresponding to the address signal outputted from the CPU 100 is not stored in the cache memory 40 and therefore no hit signal is applied, then the main memory 2 is accessed to read data.

The cache memory 40 formed of an associative memory shown in FIG. 1 comprises a plurality of writing/-comparing controlling portions 401, 402 . . . 40n arranged in the column direction and memories 411, 421. . . 4m1, 412, 422 . . . 4m2, 41n, 42n . . . 4mn arranged in the row direction corresponding to respective writing/-comparing control portions 401, 402 . . . 40n. The writing/comparing control portions 401, 402 . . . 40n are controlled by a writing/comparing controller 45.

Bit lines are connected to respective memory cells 411 to 4mn in the row direction. Each of the memory cells has, besides the usual writing and reading function, a bit matching function for collating data stored in the memory cell with a retrieval data externally applied to determine whether they are matching with each other. If the externally applied retrieval data matches the stored data, a match signal is outputted on a match line. The match signal is inputted to an OR gate 46 and a hit signal is outputted in turn from the OR gate 46.

FIG. 3 is a schematic diagram of a conventional content addressable memory cell disclosed in, for example, IEEE Journal of Solid-State Circuits, Vol. SC-7, pp. 366. As shown in FIG. 3, the content addressable memory cell comprises a combination of five n channel MOS transistors 1 to 5. The n channel MOS transistor 1 has its drain connected to a bit line 6, its gate connected to a word line 8 and its source connected to a gate of the n channel MOS transistor 3. The n channel MOS transistor 2 has its drain connected to an inversion bit line 7, its gate connected to the word line 8, and its source connected to a gate of the n channel MOS transistor 4.

The n channel MOS transistor 3 has its drain connected to a bit line 6 and its source connected to a control terminal 9. The n channel MOS transistor 4 has its drain connected to the inversion bit line 7 and its source connected to the control terminal 9. The n channel MOS transistor 5 has its drain connected to the control terminal 9 and its source and gate are connected to the match line 10.

FIGS. 4 and 5 are timing diagrams for illustrating the operation of the content addressable memory cell shown in FIG. 3.

The writing operation will be described in the following with reference to FIG. 4. In the writing operation, the data to be written is applied to the bit line 6, the inverted data thereof is applied to the inversion bit line 7, and the word line 8 is brought to an "H" level, as shown in FIG. 4 (a). When the data to be written is at the "H" level as shown in FIG. 4 (b), an "H" level signal is applied to the bit line 6 as shown in FIG. 4 (c) and an "L" level signal is applied to the inversion bit line 7 as shown in FIG. 4 (d). The n channel MOS transistor 1 becomes conductive responsive to the "H" level of the word line 8, and the "H" level data on the bit line 6 is stored in a gate capacitance of the n channel MOS transistor 3 through the n channel MOS transistor 1 as shown in FIG. 4 (e). In the similar manner, the n channel MOS transistor 2 becomes conductive responsive to the "H" level of the word line 8 and the "L" level data is stored in the gate capacitance of the n channel MOS transistor 4 through the n channel MOS transistor 2, as shown in FIG. 4 (f).

The matching operation will be described in the following with reference to FIG. 5. First, the match line 10 is precharged, a retrieval data is applied to the bit line 6 and the inverted data thereof is applied to the inversion bit line 7, and the matching operation is thus carried out. When the stored data does not match the retrieval data, the match line 10 is discharged. When the stored data matches the retrieval data, the match line 10 is not discharged.

Let us assume a case in which the stored data is at the "H" level, an "H" level signal is stored in the gate capacitance of the n channel MOS transistor 3 as shown in FIG. 5 (a), an "L" level signal is stored in the gate capacitance of the n channel MOS transistor 4 as shown in FIG. 5 (b) and the n channel MOS transistor 3 is turned on while the n channel MOS transistor 4 is kept off. When an "H" level signal such as shown in FIG. 5 (c) is applied as the retrieval data, the bit line 6 becomes "H" level and the inversion bit line 7 becomes "L" level, then the control terminal is brought to the "H"

level as shown in FIG. 5 (f) and the match line 10 is not discharged, as shown in FIG. 5 (g).

Meanwhile, when the stored data is at the "H" level as in the above described example, a "L" level signal is applied as the retrieval data, the bit line 6 becomes "L" level and the inversion bit line 7 becomes "H" level, then the n channel MOS transistor 3 is turned on while the n channel MOS transistor 4 is kept off. On this occasion, the control terminal 9 becomes "L" level. The match line 10 is discharged by a discharging path of the n channel MOS transistors 5 and 3 and the bit line 6.

Similarly, when the stored data is at the "L" level, and the retrieval data is at the "H" level, then the control terminal 9 becomes "L" level, the match line 10 is discharged by the discharging path of the n channel MOS transistors 5 and 4 and the inversion bit line 7. If the retrieval data is at the "L" level, the control terminal 9 becomes "H" level and the match line 10 is not discharged.

When "H" level signals are applied to the bit line 6 and the inversion bit line 7, the control terminal 9 becomes "H" level regardless of the value of the stored data. This state corresponds to a masked state in which matching is not carried out.

As described above, in the matching operation, the match line 10 is discharged when the stored data does not match the retrieval data. The match line 10 is not discharged when the stored data matches the retrieval data or when it is in the masked state.

In the reading operation, the bit line 6 and the inversion bit line 7 are discharged to the "L" level, and thereafter the match line 10 is brought to the "H" level. When the stored data is at the "H" level, for example, the potential on the bit line 6 rises through the n channel MOS transistors 5 and 3 by setting the match line 10 at the "H" level, since the n channel MOS transistor 3 is in the on state. Therefore an "H" level stored data is read.

On the contrary, when the stored data is at the "L" level, the potential on the inversion bit line 7 rises through the n channel MOS transistors 5 and 4 by setting the match line 10 at the "H" level, since the n channel MOS transistor 4 is in the on state. Therefore the "L" level stored data is read.

Since the content addressable memory of a conventional semiconductor associative memory device is structured as described above, refreshing operation must be frequently carried out to maintain the data stored in the gate capacitances of the transistors 3 and 4.

SUMMARY OF THE INVENTION

Therefore, an object of the present invention is to provide a semiconductor associative memory device in which a refreshing operation of the content addressable memory cell is carried out simultaneously with the matching or reading operation.

Briefly stated, the present invention provides a semiconductor associative memory device having a content addressable memory cell connected to a word line, a bit line, an inversion bit line and a match line. When a control terminal is activated by a first control circuit, that is, when a match occurs, one of first and second capacitance elements which is in an active state is refreshed through one of first and second semiconductor elements which is conductive, during the matching operation.

Meanwhile, if the control terminal is inactive, that is, when a mismatch occurs, one of the first and second capacitance elements which is in an inactive state is refreshed through one of the first and second semiconductor elements which is conductive during the matching operation. During the reading operation, the first or second capacitance element which is in the active state is refreshed through the first or second semiconductor element which is conductive in response to the activation of the bit line or the inversion bit line.

In a more preferred embodiment, the first control circuit comprises a fourth semiconductor element having a first conductive terminal thereof connected to a bit line, a second conductive terminal thereof connected to the first capacitance element, and a fifth semiconductor element having a first conductive terminal thereof connected to the inversion bit line and a second conductive terminal thereof connected to the second capacitance element. In a second control circuit, a gate electrode of a sixth semiconductor element is connected to the second conductive terminal of the fourth semiconductor element to form the first capacitance element, and a gate electrode of a seventh semiconductor element is connected to the second conductive terminal of the fifth semiconductor element to form the second capacitance element.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4(a)–4(f) and 5(a)–5(g) are timing diagrams for illustrating the writing operation and the matching operation of the conventional content addressable memory cell shown in FIG. 3;

FIGS. 7(a)–7(f) and 8(a)–8(i) are timing diagrams for illustrating the writing operation and the matching operation of the content addressable memory cell shown in FIG. 6.

DESCRIPTION OF THE PREFERRED EMBODIMENTS

Figure 1:
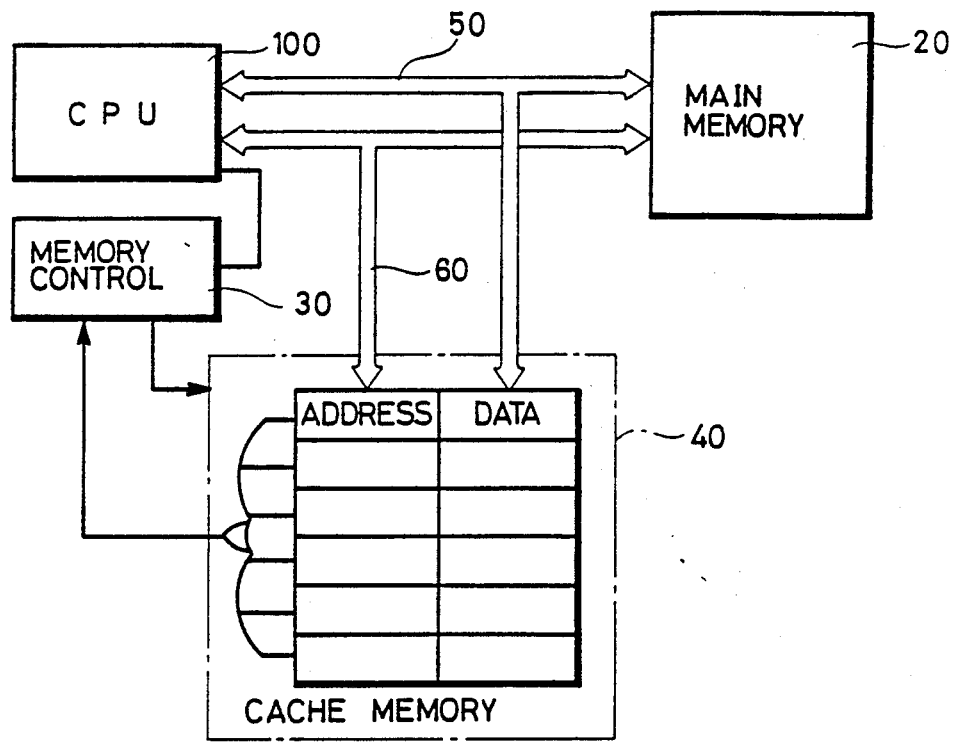
FIG. 1 is a schematic block diagram of a system employing a conventional associative memory.
Figure 2:
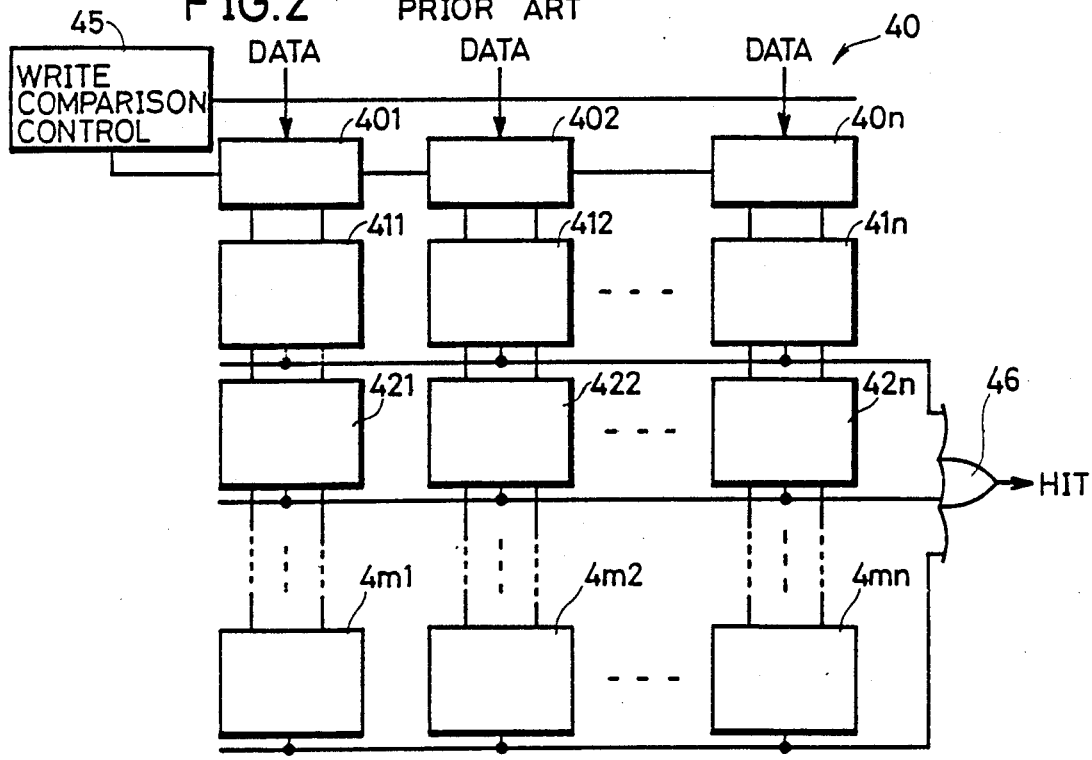
FIG. 2 is a schematic block diagram showing the whole structure of the associative memory.
Figure 3:
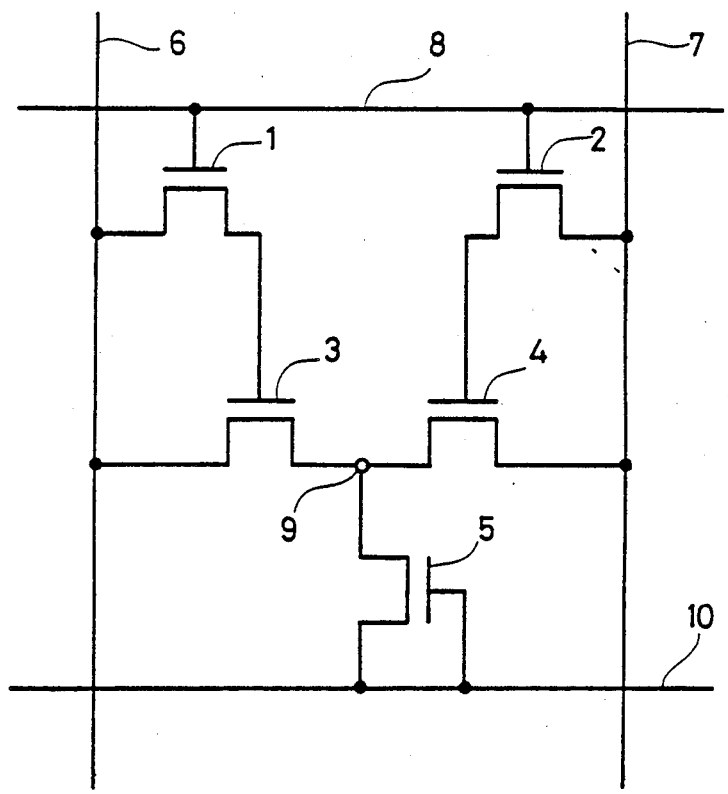
FIG. 3 is a schematic diagram showing a content addressable memory cell in a conventional semiconductor associative memory device.
Figure 6:
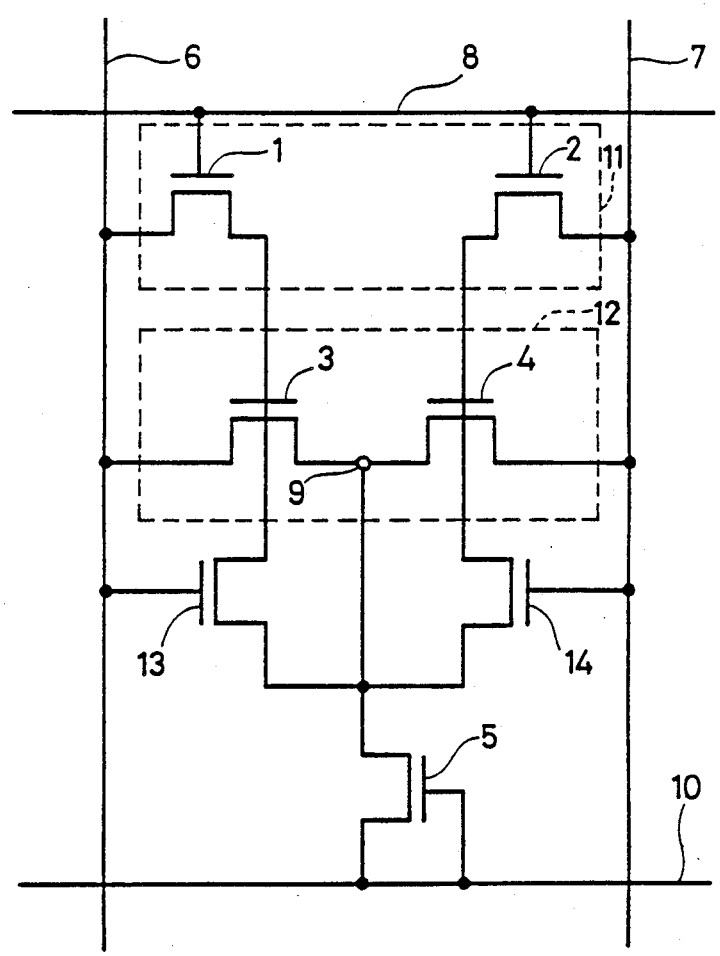
FIG. 6 is a schematic diagram showing an example of a content addressable memory cell in accordance with one embodiment of the present invention.

FIG. 6 is a schematic diagram showing one embodiment of a content addressable memory cell employed in the semiconductor associative memory device in accordance with the present invention. In the embodiment shown in FIG. 6, the n channel MOS transistors 1 to 5, the bit line 6, the inversion bit line 7, the word line 8, the control terminal 9 and the match line 10 are connected in the similar manner as in the prior art shown in FIG. 3.

More specifically, a second control circuit 11 is formed by the n channel MOS transistors 1 and 2, and when the word line 8 is activated, that is, it is brought to the "H" level, the data on the bit line 6 is stored in the gate capacitance of the n channel MOS transistor 3, which is a first capacitance element, through the n channel MOS transistor 1. THe value on the inversion bit line 7 is stored in the gate capacitance of the n channel MOS transistor 4 which is a second capacitance element, through the n channel MOS transistor 2. A first control circuit 12 is formed by the n channel MOS transistors 3 and 4 and the control terminal 9. When the n channel MOS transistor 3 is activated, that is, turned on, and the bit line 6 is activated, that is, when it is brought to the "H" level, or when the n channel MOS transistor 4 is brought to the activated state (on state) and the inversion bit line 7 is in the activated state (at the "H" level), the control terminal 9 is activated, namely, brought to the "H" level.

In this embodiment, n channel MOS transistors 13 and 14 for refreshing the n channel MOS transistors 3 and 4 are further provided. More specifically, the n channel MOS transistor 13 has its gate connected to the bit line 6, its drain connected to a gate of the n channel MOS transistor 3 and its source connected to a drain of the n channel MOS transistor 5. Similarly, the n channel MOS transistor 14 has its gate connected to the inversion bit line 7, its drain connected to the gate of the n channel MOS transistor 4 and its source connected to the drain of the n channel MOS transistor 5.

FIGS. 7 and 8 are timing diagrams for illustrating the operation of the embodiment shown in FIG. 6.

First, the writing operation will be described. As in the prior art, in the writing operation, when the data to be written is at the "H" level as shown in FIG. 7 (b), a "H" level data such as shown in FIG. 7 (c) is applied to the bit line 6 and the inverted data thereof is applied to the inversion bit line 7 as shown in FIG. 7 (d). The word line 8 is brought to the "H" level as shown in FIG. 7 (a). When the data to be written is at the "H" level, the "H" level data on the bit line 6 is stored in the gate capacitance of the n channel MOS transistor 3 through the n channel MOS transistor 1 as shown in FIG. 7 (e), and the "L" level data on the inversion bit line 7 is stored in the gate capacitance of the n channel MOS transistor 4 through the n channel MOS transistor 2, as shown in FIG. 7 (f).

If the data to be written is at the "L" level, the data "L" on the bit line 6 is stored in the gate capacitance of the n channel MOS transistor 3 through the n channel MOS transistor 1 and the "H" level data on the inversion bit line 7 is stored in the gate capacitance of the n channel MOS transistor 4 through the n channel MOS transistor 2.

The matching operation will be described in the following with reference to FIG. 8. The basic operation of the matching operation is the same as in the prior art shown in FIG. 3. Namely, the match line 10 is precharged, a retrieval data is applied to the bit line 6 and the inverted data is applied to the inversion bit line 7.

Let us assume that the stored data is at the "H" level, an "H" level signal is applied to the gate capacitance of the n channel MOS transistor 3 as shown in FIG. 8 (a), an "L" level signal is applied to the gate capacitance of the n channel MOS transistor 4 as shown in FIG. 8 (b), the n channel MOS transistor 3 is on and the n channel MOS transistor 4 is off. In this state, when a "H" level signal which is the same level as the stored data, is applied as the retrieval data as shown in FIG. 8 (c), the bit line 6 becomes "H" level as shown in FIG. 8 (d) and the inversion bit line 7 becomes "L" level as shown in FIG. 8 (e), then the potential on the bit line 6 is applied to the control terminal 9 through the n channel MOS transistor 3, whereby the control terminal 9 is brought to the "H" level as shown in FIG. 8 (f) and the match line 10 is not discharged as shown in FIG. 8 (g).

Since the bit line 6 is at the "H" level, the n channel MOS transistor 13 is turned on as shown in FIG. 8 (h), and since the inversion bit line 7 is at the "L" level, the n channel MOS transistor 14 is turned off as shown in FIG. 8 (i). The "H" level signal on the control terminal 9 is applied to the gate of the n channel MOS transistor 3 through the n channel MOS transistor 13 and the gate capacitance thereof is refreshed to the state of "H" level.

Similarly, when the stored data is at the "H" level and an "L" level signal, which does not match the stored data, is applied as the retrieval data, the bit line 6 becomes "L" level and the inversion bit line 7 becomes "H" level, then the potential on the bit line 6 is applied to the control terminal 9 through the n channel MOS transistor 3, whereby the control terminal 9 is brought to the "L" level. The match line 10 is discharged through a discharging path constituted by the n channel MOS transistors 5 and 3 and the bit line 6. On this occasion, since the bit line 6 is at "L" level, the n channel MOS transistor 13 is turned off. Meanwhile, since the inversion bit line 7 is at the "H" level, the n channel MOS transistor 14 is turned on. The "L" level signal of the control terminal 9 is applied to the gate of the n channel MOS transistor 4 through the n channel MOS transistor 14, and the gate capacitance thereof is refreshed to the state of "L" level.

When the stored data is at the "L" level and a "H" level signal, which does not match the stored data, is applied as the retrieval data, the potential on the inversion bit line 7 is applied to the control terminal 9 through the n channel MOS transistor 4, whereby the control terminal is brought to the "L" level. The match line 10 is discharge through the n channel MOS transistors 5 and 4 and the inversion bit line 7, and the gate capacitance of the n channel MOS transistor 3 is refreshed to the "L" level through the n channel MOS transistor 13.

When the stored data is at the "L" level and an "L" level data, which matches the stored data, is applied as the retrieval data, the potential on the inversion bit line 7 is applied to the control terminal 9 through the n channel MOS transistor 4, whereby the control terminal 9 is brought to the "H" level. The match line 10 is not discharged, and the gate capacitance of the n channel MOS transistor 4 is refreshed to the "H" level through the n channel MOS transistor 14.

As described above, in the matching operation, when the stored data does not match the retrieval data, the match line 10 is discharged and, at the same time, the gate capacitance of one of the n channel MOS transistors 3 and 4 in which an "L" level signal is stored is refreshed to the "L" level. Meanwhile, when the stored data matches the retrieval data, the match line 10 is not discharged and the gate capacitance of one of the n channel MOS transistors 3 and 4 in which an "H" level signal is stored is refreshed to the "H" level.

The reading operation will be described in the following. The basic operation of reading is the same as the prior art. Namely, the bit line 6 and the inversion bit line 7 are discharged to the "L" level and thereafter, the match line 10 is set at the "H" level.

When the stored data is at the "H" level, the potential on the bit line 6 rises through the n channel MOS transistors 5 and 3 by setting the match line 10 at the "H" level, since the n channel MOS transistor 3 is in the on state, whereby the stored data of "H" level is read. On this occasion, since the bit line 6 becomes "H" level, the n channel MOS transistor 13 is turned on and the gate capacitance of the n channel MOS transistor 3 is refreshed to the "H" level through the transistor 13.

On the contrary, when the stored data is at the "L" level, since the n channel MOS transistor 4 is in the on state, the potential of the inversion bit line 7 rises through the n channel MOS transistors 5 and 4 by setting the match line 10 at the "H" level, whereby the the stored data at the "L" level is read. On this occasion, since the inversion bit line 7 becomes "H" level, the n channel MOS transistor 14 turns on and the gate capacitance of the n channel MOS transistor 4 is refreshed to the "H" level through the transistor 14. As described above, according to one embodiment of the present invention, one of the first and second capacitance elements is refreshed through one of the first and second semiconductor elements which is conductive during the matching operation. In the reading operation, one of the first and second capacitance elements is refreshed through one of the first and second semiconductor elements which is conductive. Therefore the capacitance elements can be refreshed simultaneously with the matching operation and the reading operation.

In this embodiment, the match line 10 is discharged when the stored data matches the retrieval data while the match line 10 is not discharged but maintained as it is when the stored data does not match the retrieval data.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a content addressable memory cell connected to a word line, a bit line, an inversion bit line and a match line, wherein:
    said memory cell comprises:
    first control means, including first and second transistors and a control terminal, for applying a first predetermined potential to said control terminal when said first transistor is in an active state and said bit line is at a first level or when said second transistor is in an active state and said inversion bit line is at said first level;
    second control means for storing a level of said bit line on a gate capacitance of said first transistor and for storing a level of said inversion bit line on a gate capacitance of said second transistor when said word line is at an activation level;
    a first semiconductor element connected between said control terminal and a gate of said first transistor;
    a second semiconductor element connected between said control terminal and a gate of said second transistor;
    a third semiconductor element connected between said control terminal and said match line, which becomes conductive when said match line is at a second predetermined potential.

2. A semiconductor associative memory device according to claim 1, wherein
    said second control means comprises:
    a fourth semiconductor element including a gate electrode and first and second conductive terminals, said gate electrode connected to said word line, said first conductive terminal connected to said bit line and said second conductive terminal connected to said first transistor; and
    a fifth semiconductor element including a gate electrode and first and second conductive terminals, said gate electrode of said fifth semiconductor element connected to said word line, said first conductive terminal of said fifth semiconductor element connected to said inversion bit line and said second conductive terminal of said fifth semiconductor element connected to said second transistor.

3. A semiconductor associative memory device according to claim 1 wherein
    said first transistor comprises:
    a gate electrode and first and second conductive terminals, said gate electrode of said first transistor connected to the second conductive terminal of said fourth semiconductor element; and
    a gate electrode and first and second conductive terminals, said gate electrode of said second transistor connected to the second conductive terminal of said fifth semiconductor element.

4. A semiconductor associative memory device having a content addressable memory cell connected to a word line, a bit line, an inversion bit line and a match line, wherein
    said memory cell comprises:
    a first semiconductor element including a gate electrode and first and second conductive terminals, said gate electrode connected to said word line, and said first conductive terminal connected to said bit line;
    a second semiconductor element having a gate electrode and first and second conductive terminals, said gate electrode of said second semiconductor element connected to said word line and said first conductive terminal of said second semiconductor element connected to said inversion bit line;
    a third semiconductor element having a gate electrode and first and second conductive terminals, said gate electrode of said third semiconductor element connected to the second conductive terminal of said first semiconductor element and said first conductive terminal of said third semiconductor element connected to said bit line;
    a fourth semiconductor element having a gate electrode and first and second conductive terminals, said gate electrode of said fourth semiconductor element connected to the second conductive terminal of said second semiconductor element and said first conductive terminal of said fourth semiconductor element connected to said inversion bit line;
    a fifth semiconductor element having a gate electrode and first and second conductive terminals, said gate electrode of said fifth semiconductor element connected to said bit line and said first conductive terminal of said fifth semiconductor element connected to the gate electrode of said third semiconductor element;
    a sixth semiconductor element having a gate electrode and first and second conductive terminals, said gate electrode of said sixth semiconductor element connected to said inversion bit line and said first conductive terminal of said sixth semiconductor element connected to the gate electrode of said fourth semiconductor element; and
    a seventh semiconductor element having a gate electrode and first and second conductive terminals, said gate electrode and said second conductive terminal of said seventh semiconductor element connected to said match line and said first conductive terminal of said seventh semiconductor element connected to the respective second conductive terminals of said third, fourth, fifth and sixth semiconductor elements.

* * * * *